US012772652B2

(12) United States Patent
Hack et al.

(10) Patent No.: US 12,772,652 B2
(45) Date of Patent: Oct. 20, 2026

(54) ORGANIC ELECTROLUMINESCENT DEVICES

(71) Applicant: Universal Display Corporation, Ewing, NJ (US)

(72) Inventors: Michael Hack, Carmel, CA (US); Michael S. Weaver, Princeton, NJ (US); Nicholas J. Thompson, New Hope, PA (US); Michael Fusella, Lawrenceville, NJ (US); Xin Xu, Plainsboro, NJ (US)

(73) Assignee: Universal Display Corporation, Ewing, NJ (US)

( * ) Notice: Subject to any disclaimer, the term of this patent is extended or adjusted under 35 U.S.C. 154(b) by 388 days.

(21) Appl. No.: 18/497,457

(22) Filed: Oct. 30, 2023

(65) Prior Publication Data

US 2024/0172462 A1 May 23, 2024

Related U.S. Application Data

(60) Provisional application No. 63/444,323, filed on Feb. 9, 2023, provisional application No. 63/426,568, filed on Nov. 18, 2022.

(51) Int. Cl.

*H10K 50/11* (2023.01)
*C09K 11/06* (2006.01)
*H10K 50/805* (2023.01)
*H10K 59/10* (2023.01)
*H10K 77/10* (2023.01)

(52) U.S. Cl.

CPC .............. *H10K 50/11* (2023.02); *C09K 11/06* (2013.01); *H10K 50/805* (2023.02); *H10K 59/10* (2023.02); *H10K 77/10* (2023.02)

(58) Field of Classification Search

None
See application file for complete search history.

(56) References Cited

U.S. PATENT DOCUMENTS

| | | | |
|---|---|---|---|
| 4,769,292 | A | 9/1988 | Tang |
| 5,247,190 | A | 9/1993 | Friend |
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |

(Continued)

FOREIGN PATENT DOCUMENTS

| | | | |
|---|---|---|---|
| WO | 2008057394 | A1 | 5/2008 |
| WO | 2010011390 | A2 | 1/2010 |

OTHER PUBLICATIONS

Baldo et al. "Highly efficient phosphorescent emission from organic electroluminescent devices", Nature, vol. 395, pp. 151-154, 1998.

(Continued)

*Primary Examiner* — Bilkis Jahan
(74) *Attorney, Agent, or Firm* — Butzel Long

(57) ABSTRACT

Organic electroluminescent devices are provided, including devices having a tandem structure in which two or more plasmonic OLEDs are arranged in a stack. The plasmonic OLEDs may be inverted or non-inverted. A common electrode disposed between the OLEDs or an outer electrode of the device provides the enhancement layer for one or plasmonic OLEDs in the stack.

20 Claims, 9 Drawing Sheets

(56) References Cited

U.S. PATENT DOCUMENTS

| | | | |
|---|---|---|---|
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 6,537,688 | B2 | 3/2003 | Silvernail |
| 6,597,111 | B2 | 7/2003 | Silvernail |
| 6,664,137 | B2 | 12/2003 | Weaver |
| 6,835,950 | B2 | 12/2004 | Brown |
| 6,888,305 | B2 | 5/2005 | Weaver |
| 6,888,307 | B2 | 5/2005 | Silvernail |
| 6,897,474 | B2 | 5/2005 | Brown |
| 7,187,119 | B2 | 3/2007 | Weaver |
| 7,279,704 | B2 | 10/2007 | Walters |
| 7,431,968 | B1 | 10/2008 | Shtein |
| 7,683,534 | B2 | 3/2010 | Weaver |
| 7,968,146 | B2 | 6/2011 | Wagner |
| 2003/0230980 | A1 | 12/2003 | Forrest |
| 2004/0174116 | A1 | 9/2004 | Lu |
| 2013/0240847 | A1 * | 9/2013 | Zakhidov ............... H10K 50/81 977/842 |
| 2013/0243911 | A1 * | 9/2013 | Abegglen ............... A47J 31/22 426/115 |
| 2015/0137135 | A1 * | 5/2015 | Green .................. H10D 30/015 438/237 |
| 2016/0035719 | A1 * | 2/2016 | Kanechika ........... H10D 30/015 257/195 |
| 2017/0018617 | A1 * | 1/2017 | Xia .......................... H10D 1/66 |
| 2017/0229663 | A1 | 8/2017 | Tsai |
| 2017/0358495 | A1 * | 12/2017 | Jiang .................... H10D 30/015 |
| 2021/0265584 | A1 * | 8/2021 | Fusella .................. H10K 59/38 |

OTHER PUBLICATIONS

Baldo, et al., “Very high-efficiency green organic light-emitting devices based on electrophosphorescence”, Applied Physics Letters, Jul. 5, 1999, 4 pp., vol. 75, No. 1, American Institute of Physics, Melville, NY, USA.

* cited by examiner

FIG. 7G
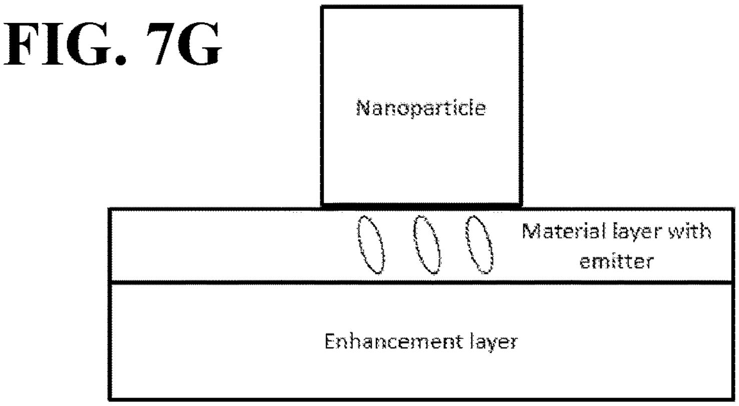
FIG. 7H
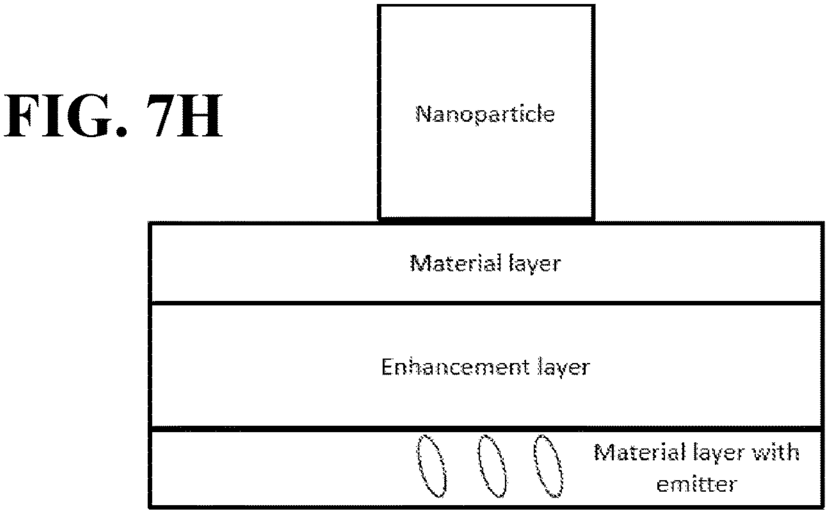
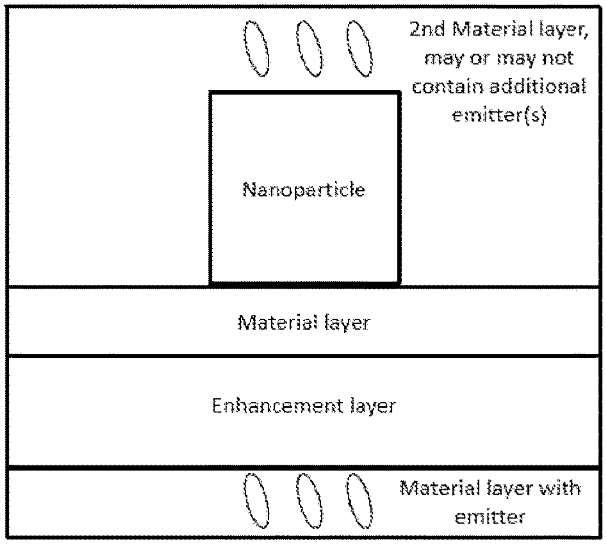
FIG. 7I

ORGANIC ELECTROLUMINESCENT DEVICES

CROSS-REFERENCE TO RELATED APPLICATIONS

This application claims the priority benefit of U.S. Provisional Application No. 63/426,568, filed Nov. 18, 2022 and U.S. Provisional Application No. 63/444,323, filed Feb. 9, 2023, the entire contents of each of which is incorporated herein by reference.

FIELD

The present invention relates to organic emissive devices having a tandem plasmonic structure, which may include inverted and/or non-inverted organic light emitting diode structures, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |

-continued

| Color | CIE Shape Parameters |
|---|---|
| Central Blue | Locus: [0.1746, 0.0052]; [0.0326, 0.3530]; Interior: [0.2268, 0.3321] |
| Central Yellow | Locus: [0.373 1, 0.6245]; [0.6270, 0.3725]; Interior: [0.3 700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

An organic emissive device is provided which includes a substrate; a first organic light emitting device (OLED) disposed over the substrate, the first OLED comprising a first emissive layer of a first organic emissive material; a second OLED disposed over the substrate and in a stack with the first OLED, the second OLED comprising a second emissive layer of a second organic emissive material; and an enhancement layer disposed over the substrate, the enhancement layer comprising a plasmonic material exhibiting surface plasmon resonance that non-radiatively couples to both the first and second organic emissive materials and transfers excited state energy from each non-radiatively-coupled organic emissive material to non-radiative modes of surface plasmon polaritons, wherein the enhancement layer is disposed a threshold distance away from the first and/or second emissive layers.

The enhancement layer may be disposed a threshold distance away from the first emissive layer and the second emissive layer. The first emissive layer may include a phosphorescent emitter. The enhancement layer may be disposed between the first OLED and the second OLED, and may function as an anode or a cathode for both OLEDs, or an anode for one and a cathode for the other. An outcoupling layer in the device may outcouple the surface plasmon polaritons from the device as photons. The outcoupling layer may include a plurality of nanoparticles and may outcouple light from both the first emissive layer and the second emissive layer. One of the OLEDs may be an inverted OLED and the other a non-inverted OLED or an inverted OLED. The first and second OLEDs may be disposed immediately adjacent to one another and may share a common anode or a common cathode. The common electrode may be externally addressable. The common electrode may be the enhancement layer. Each of the first and/or second emissive materials may include a phosphorescent emitter, a phosphor-sensitized fluorescent emitter, a thermally-activated delayed fluorescence (TADF) emitter, a phosphor-sensitized TADF, and/or a fluorescent emitter. Each OLED may have a total thickness of 5 nm-100 nm, 10 nm-70 nm, or 20 nm-50 nm. An outer electrode of the first OLED may be electrically connected to an outer electrode of the second OLED.

A topmost electrical contact of the device may be transparent or semi-transparent. The device may include two or more OLEDs connected in series and/or in a stack. The device may be arranged and configured to emit blue, white, or any other desired color or colors of light. The first OLED and/or the second OLED may include a reflective electrode and a semi-transparent layer that form a microcavity structure. The reflective electrode may be the enhancement layer. The enhancement layer may be an outer electrode of the device. The enhancement layer may be a top cathode disposed over the first emissive layer and the second emissive layer or a bottom anode and the first emissive layer and the second emissive layer are disposed over the enhancement layer. The device may include one or more color filters, downconversion layers, quantum dots, or a combination thereof arranged in a stack with the first and second OLEDs.

The device may be or may be a part of a consumer electronic device, which may be at least one type selected from the group consisting of: a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign.

In an embodiment, an organic emissive device is provided that includes a substrate; a first organic light emitting device (OLED) disposed over the substrate, the first OLED comprising a first emissive layer of a first organic emissive material; a second OLED disposed over the substrate and in a stack with the first OLED, the second OLED comprising a second emissive layer of a second organic emissive material; a common electrode disposed between the first and second OLEDs, wherein the common electrode has a transparency of not more than 15% and an enhancement layer disposed over the substrate, the enhancement layer comprising a plasmonic material exhibiting surface plasmon resonance that non-radiatively couples to the first and/or second organic emissive materials and transfers excited state energy from each non-radiatively-coupled organic emissive material to non-radiative modes of surface plasmon polaritons, wherein the enhancement layer is disposed a threshold distance away from the first and/or second emissive layers.

BRIEF DESCRIPTION OF THE DRAWINGS

FIG. 7G, FIG. 7H, and FIG. 7I show examples of one or more emissive outcoupling layers in close proximity to the enhancement layer as disclosed herein.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
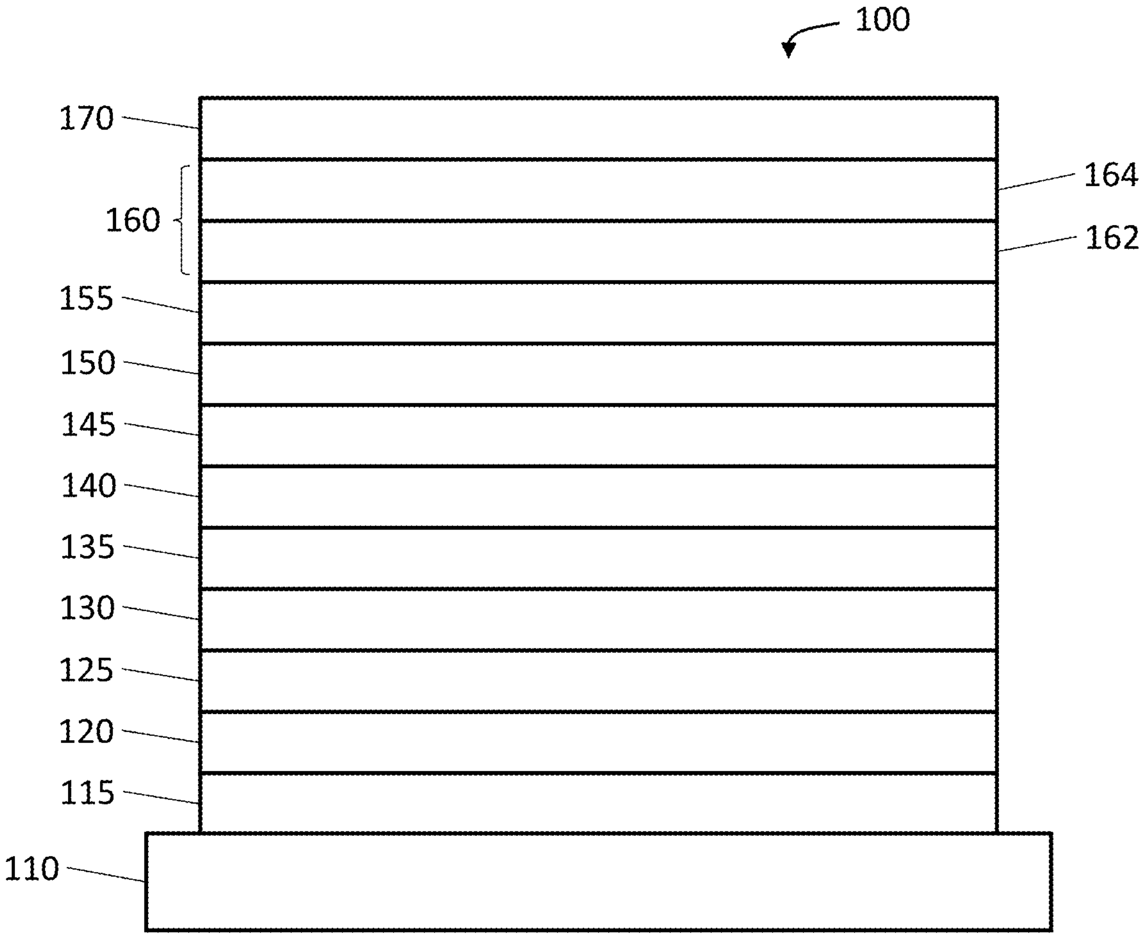
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. Barrier layer 170 may be a single- or multi-layer barrier and may cover or surround the other layers of the device. The barrier layer 170 may also surround the substrate 110, and/or it may be arranged between the substrate and the other layers of the device. The barrier also may be referred to as an encapsulant, encapsulation layer, protective layer, or permeation barrier, and typically provides protection against permeation by moisture, ambient air, and other similar materials through to the other layers of the device. Examples of barrier layer materials and structures are provided in U.S. Pat. Nos. 6,537,688, 6,597,111, 6,664,137, 6,835,950, 6,888,305, 6,888,307, 6,897,474, 7,187,119, and 7,683,534, each of which is incorporated by reference in its entirety.

Figure 2:
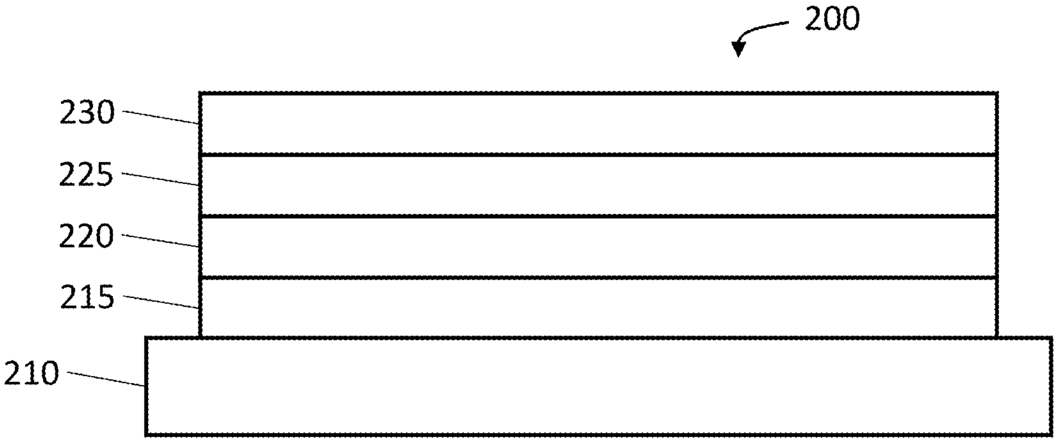
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. In general, an emissive layer includes emissive material within a host matrix. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light based on an injected electrical charge, where the initial light may be altered by another layer such as a color filter or other color altering layer that does not itself emit an initial light within the device, but may re-emit altered light of a different spectra content based upon absorption of the initial light emitted by the emissive layer and downconversion to a lower energy light emission. In some embodiments disclosed herein, the color altering layer, color filter, upconversion, and/or downconversion layer may be disposed outside of an OLED device, such as above or below an electrode of the OLED device.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for interventing layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta$ES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta$ES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination With Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Tandem OLEDs, i.e., devices in which two or more OLEDs are arranged in a single vertical stack, are becoming more common as they allow for improved display brightness and lifetime. For example, significant commercial investment is being made to implement Gen 6 or larger OLED display manufacturing based on a tandem OLED architecture. Embodiments disclosed herein provide tandem OLED structures where at least two OLEDs in the tandem device stack benefit from plasmonic enhancement from a common enhancement layer. Some recent devices, such as those disclosed in U.S. Pat. No. 11,056,540, the disclosure of which is incorporated in its entirety, describe a tandem OLED with plasmonic enhancement. However, such devices use a single-stack plasmonic OLED fabricated over and in a common stack with a conventional non-plasmonic OLED, with an intervening CGL between the two stacks. In contrast, embodiments disclosed herein do not require a CGL and allow for multiple plasmonic effects.

FIGS. 3A-3F show examples of a tandem structure that includes a common enhancement layer that provides plasmonic enhancement for at least two OLED structures in the stack. Each device includes two emissive layers 330, 360 and an enhancement layer, which may be provided by a central common cathode 320 or a CGL 322. The enhancement layer may include a plasmonic material exhibiting surface plasmon resonance, which non-radiatively couples to organic emissive materials in both emissive layers 330, 360. The plasmonic material transfers excited state energy from each non-radiatively-coupled organic emissive material (i.e., the emissive materials in emissive layers 330, 360) to non-radiative modes of surface plasmon polaritons. The enhancement layer may be disposed within a threshold distance of one or both of the emissive layers 330, 360, with the threshold distance being the same range as previously defined herein. Structures as shown in FIGS. 3A-3F may be described as including two OLEDs, each of which includes two outer electrodes and all intervening layers. For example, in FIG. 3A, a first OLED includes the anode 311, cathode 320, and all intervening layers 350, 355, 360, 365, 370. A second OLED includes the anode 310, cathode 320, and all intervening layers 315, 325, 330, 335, 340, including any other components within those layers such as nanoparticles or other outcoupling structure 305. Other layers may be included in an OLED, including any of the layers and components described with respect to FIGS. 1-2 and as are known in the art.

Additional OLED or inverted OLED (IOLED) devices may be grown around the basic structure or otherwise incorporated into the stack structure shown in FIGS. 3A-F. In some embodiments, any such additional OLEDs may benefit from plasmonic enhancement due to the common enhancement layer shown, or they may be non-plasmonic OLEDs, or they may be plasmonic OLEDs that include separate and distinct enhancement layers that provide plasmonic enhancement separately from the common enhancement layer shown.

Figure 3A:
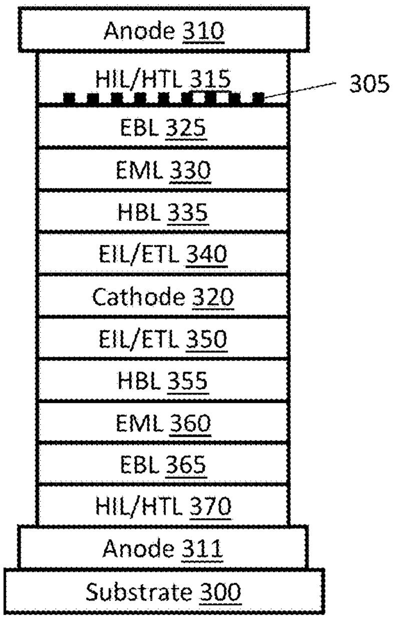
FIGS. 3A-3E show examples of plasmonic tandem OLED that include an OLED in series with an IOLED and a common electrode to form plasmons, with an outcoupling layer to emit the plasmons as photons as disclosed herein.
Figure 3B:
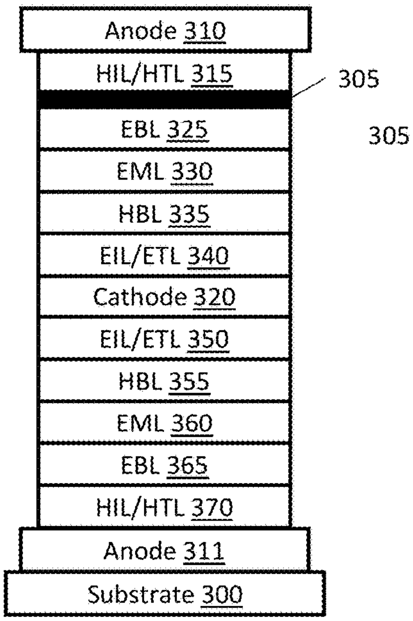
Figure 3C:
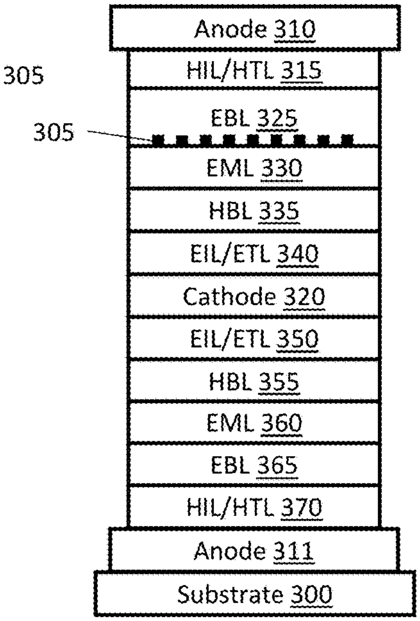
Figure 3D:
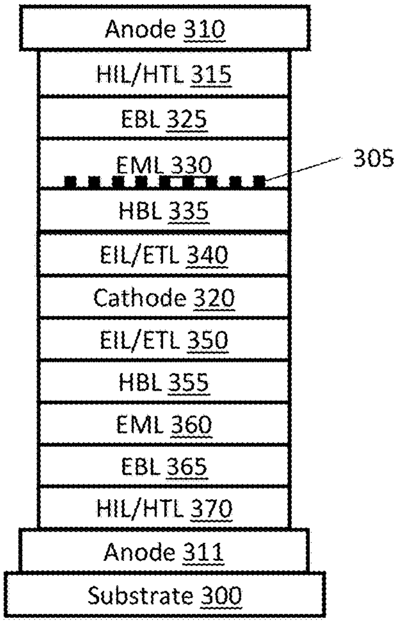
Figure 3E:
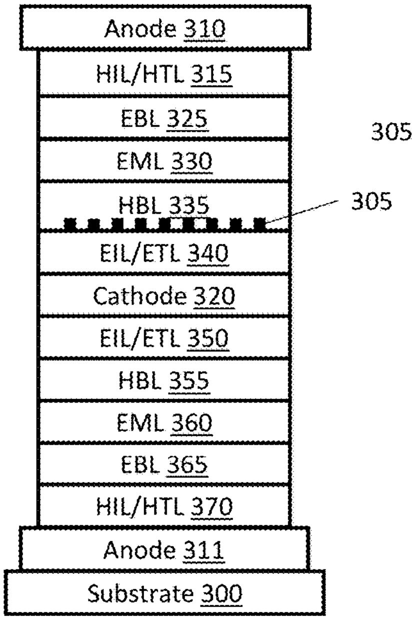

FIGS. 3A-3E show example device structures that include an inverted OLED disposed over a non-inverted OLED; FIGS. 3G and 3H show example device structures in which an OLED is disposed over an IOLED. As used herein, an "inverted" OLED is one in which the cathode is closer to the primary supporting substrate than the anode of the same OLED structure, as previously shown and described with respect to FIG. 2. Conversely, a "non-inverted" or "regular" OLED is one in which the anode is closer to the primary supporting substrate, as shown in FIG. 1, when distinguishing from an inverted OLED, which otherwise may be referred to as an "OLED". In a device that includes both an inverted OLED and a non-inverted OLED as disclosed herein, the device voltage is the same or nearly the same as for a single-stack OLED (i.e., a device that includes only a single discrete OLED in the emissive stack), but the brightness and lifetime are similar to those of a tandem device.

A common cathode 320 or common anode 395 is disposed between the two devices and, as used herein, is considered to be part of each device. That is, referring to FIGS. 3A-3E, the inverted OLED may be described as including or being defined by the anode 310, the common cathode 320, and all intervening layers, while the non-inverted OLED may be described as including or being defined by the common cathode 320, the anode 311, and all intervening layers. The entire device is disposed over a substrate 300 and may be grown or otherwise deposited on the substrate 300 during fabrication. In the inverted OLED, the common cathode 320 is closer to the substrate than the anode 310; in the non-inverted OLED, the anode 311 is closer to the substrate 300 than the common cathode 320. The inverted OLED includes the anode 310, common cathode 320, and all layers shown between them 315-340; similarly, the non-inverted OLED includes the common cathode 320, the individual anode 311, and all layers between them 350-370.

The common cathode 320 may act as and provide an enhancement layer for one or more plasmonic devices as disclosed herein in the stack. In some embodiments, a separate enhancement layer may be disposed between the OLEDs, for example where the common cathode 320 includes multiple layers or regions, some of which provide a cathode to one or both OLEDs and others of which provide the enhancement layer. The common cathode 320 may be described as disposed "between" the two OLEDs, though it is also considered a part of each OLED.

Each of the OLEDs may include some, any, or all of the layers typically used in an OLED stack. In the example shown in FIGS. 3A-3H, each device includes the following layers as shown:

hole injection and/or transport layers 315, 370
electron blocking layers 325, 365
emissive layers 330, 360
hole blocking layers 335, 355
electron injection and/or transport layers 340, 350

More generally, any non-inverted OLED or inverted OLED in a device as disclosed herein may include any of the layers shown and described with respect to FIG. 1, including any of the materials, combinations, arrangements, and the like as are known for OLED structures in the art. Notably, the layers in each OLED are arranged relative to the common cathode and each separate anode as would be expected for a separate device. For example, the electron injection/transport layer or layers 340, 350 are disposed close to the common cathode 320, while the hole injection and transport layers are disposed farther away from the common cathode 320 and close to each respective anode 310, 311. Similarly, electron transport layers 340, 350 may be disposed closer to the common cathode 320 than each of the corresponding emissive layers 330, 360, respectively. In an arrangement in which the common electrode 320 is an anode, the opposite arrangement may be used so that the electron transport layers 340, 350 are disposed farther away from the common anode than the corresponding emissive layers 330, 360, respectively. Hole transport layers 320, 370 may be arranged closer to a common anode than the corresponding emissive layers 330, 360, respectively, when a common anode is used (i.e., the inverse of the arrangement in FIG. 3); or the hole transport layers 320, 370 may be disposed farther away from a common cathode 320 as shown in FIG. 3. FIGS. 3G-3H show examples arrangements in which the common electrode is a common anode 395 and the outer electrodes are cathodes 390, 391. Although shown with illustrative arrangements of the nanoparticle outcoupling layers 305, more generally an outcoupling component 305 may be disposed at any suitable location within the stack as disclosed herein, including but not limited to the placements shown in FIGS. 3A-3F relative to the central electrode and the substrate 300. The stack may include an outcoupling component 305 such as an arrangement of nanoparticles, which may be arranged at one edge surface of any of the layers as shown, such as the hole injection and/or transport layer 315, electron blocking layer 325, emissive layer 330, or hole blocking layer 335. FIGS. 3A and 3C-3F show arrangements in which the outcoupling component 305 is such an arrangement. More generally, any suitable outcoupling structure may be used as shown in FIG. 3B; such a component may be arranged at a layer interface similar to the arrangements shown for the nanoparticle arrangements, or in any other suitable placement and arrangement as known in the art.

Figure 3F:
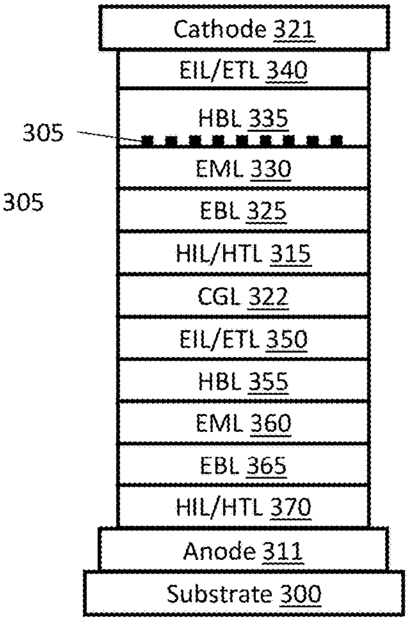
FIG. 3F shows a similar device that uses a CGL and two non-inverted OLEDs as disclosed herein.
Figure 3G:
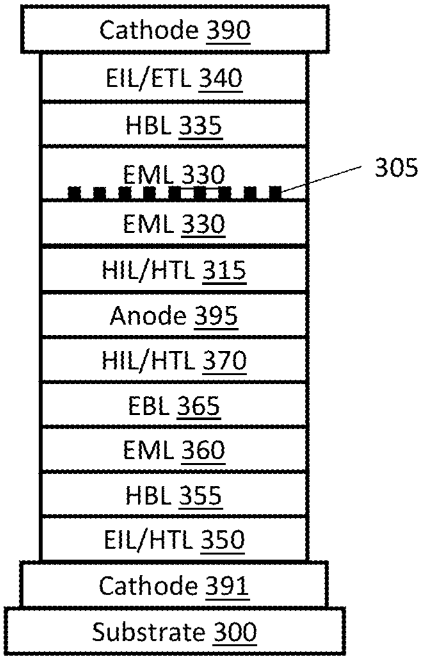
FIGS. 3G-3H show examples in which the common electrode is an anode.
Figure 3H:
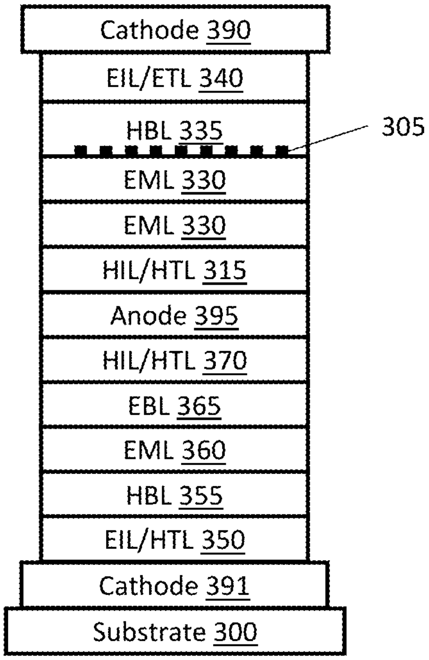

FIG. 3F shows an arrangement in which both OLEDs in the stack are non-inverted OLEDs with a common charge generation layer (CGL) 322. In this example, one OLED is defined by the cathode 321, the CGL 322, and all intervening layers; the other is defined by the CGL 322, anode 311, and all intervening layers. As is known in such structures, the CGL may act function as and provide an electrode to each OLED in the stack. That is, it may function as an anode with respect to the upper device (operating in conjunction with the top cathode 321), and as a cathode with respect to the bottom device (operating in conjunction with anode 311). Because the CGL also may act as and provide the enhancement layer for one or both devices, in this structure the enhancement layer acts as an anode for one device and a cathode for the other. More generally, a CGL disposed between and forming a part of the two OLEDs may act as an anode or a cathode for each OLED, and each OLED in this configuration may be a non-inverted OLED or an inverted OLED.

All device structures shown in FIGS. 3A-3H may be inverted in their entirety, such that the substrate is disposed over the other layers instead of below the anode 311. That is, the device may be arranged such that the anode 310 in FIGS. 3A-3E, the cathode 321 in FIG. 3F, or the cathode 390 in FIGS. 3G-3H is disposed adjacent to the substrate. One effect of such an arrangement is that the outcoupling component 305 is disposed within the non-inverted OLED (i.e., the OLED closest to the substrate as shown in FIGS. 3A-3E) instead of within the inverted OLED in FIGS. 3A-3E, and within the inverted OLED in FIGS. 3G-3H.

In the examples shown in FIGS. 3A-3H, at least one OLED in the stack is a plasmonic OLED which includes a cathode that is arranged and configured to act as an enhancement layer exhibiting surface plasmon resonance. For example, the cathode 320 in FIGS. 3A-3F may be an enhancement layer for both the inverted OLED and the non-inverted OLED. The outcoupling layer 305, such as a nanoparticle-based outcoupling layer, generally may be disposed on the other side of the common cathode 320 relative the first (lower) OLED stack, separated by a dielectric comprised of organic materials. The outcoupling layer 305 converts energy in the plasmon mode of the enhancement layer, such as common cathode 320, and radiates that energy as photons. An outcoupling layer as disclosed herein may be a separate layer distinct from any organic layers or other layers within the OLED as shown in FIG. 3B, or it may be formed from nanoparticles or other components that are embedded within a portion of one or more layers. The outcoupling layer may outcouple light generated by one or both OLEDs, i.e., light that is initially generated by the EML 330 and/or the EML 360 of each OLED in the stack.

In some embodiments, both OLEDs in the stack may be plasmonic OLEDs. That is, the cathode 320 may be an enhancement layer for both the inverted OLED and the non-inverted OLED. The outcoupling layer 305 of the bottom plasmonic OLED (closer to the substrate 300) is formed in the middle of the upper OLED stack—in this case an inverted OLED. The second EML 330 may be disposed between the common cathode 320 and the nanoparticles of the outcoupling layer 305, such as in the arrangements shown in FIGS. 3A-3C. Excitons generated in the second EML 330 will also couple to the enhancement layer, provided by the common cathode 320, and be radiated as photons by the outcoupling layer 305. In this way excitons from both stacks are quenched by the enhancement layer/common cathode 320 and radiated as photons.

A tandem device that includes an inverted OLED and a non-inverted OLED as shown in FIGS. 3A-3E and 3G-3H does not require a CGL (such as the CGL 322 in FIG. 3F) if the tandem is a two-stack device, because the central common electrode 320 is a plasmonic enhancement layer, for example made from or including silver. The central common cathode 320 is externally addressable and the overall tandem device has an operating voltage similar to a single stack OLED. The two anodes 310, 311 may be electrically connected or may be driven independently. As a result, the overall device will have a low voltage, a high efficiency, and a long operational lifetime with a close to Lambertian emission profile.

Figure 4:
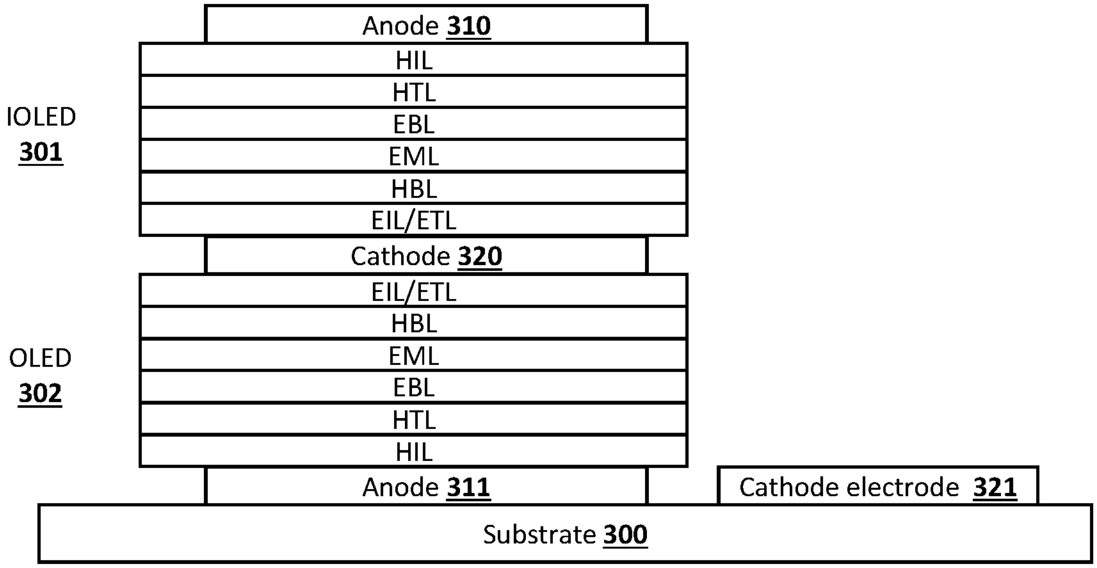
FIG. 4 shows an example of layer alignment resulting from a deposition process for a plasmonic tandem OLED as disclosed herein.

Devices as shown in FIGS. 3A-3E may include two external anode connections and one external cathode connection. Similarly, the devices shown in FIGS. 3G-3H may have two external cathode connections and one external anode connection. Patterning techniques such as photolithography (eLeap) or other techniques may be used to make electrical connections to the central common cathode 320 in FIGS. 3A-3E or the common anode 395 in FIGS. 3G-3H. FIG. 4 shows a similar device with a different fabrication and patterning approach, in which external connections to the lower anode 311 and the central common cathode 320 are patterned on the substrate 300. In this configuration, the organic layers in the lower OLED 302 may be deposited through a mask over the anode 311 and extend beyond the anode such that the deposited cathode does not short directly to the anode. The central common cathode 320 is then deposited such that it also connects to the patterned cathode electrode 321 on the substrate 300. Finally the organic layers in the top OLED 301 and the top anode 310 are deposited. The emissive layers (EMLs) may be deposited with, for example, a fine metal mask to define different color subpixels. A similar process may be performed for the arrangements shown in FIGS. 3G-3H with appropriate changes in layer order. FIG. 4 also shows an exaggerated view of a configuration of relative staggered positioning of the various layers in the OLEDs 301, 302 to allow for electrical connections and the like. An outcoupling layer as shown in FIGS. 3A-3H may be disposed within the IOLED 301 or the OLED 302, in any arrangement as disclosed herein.

FIGS. 5A-5E show other example configurations for a device as disclosed herein that includes two EMLs 330, 360. One emissive region 360 is in a plasmonic OLED with a cathode designed to act as an enhancement layer exhibiting surface plasmon resonance, as previously disclosed. An outcoupling component 305, such as a nanoparticle based outcoupling layer, is placed on the other side of the common cathode 320 away from the first stack, separated by a dielectric comprised of organic materials. The outcoupling layer 305 converts energy in the plasmon mode of the enhancement layer/common cathode 320 and radiates that energy as photons. The outcoupling layer 305 of the first plasmonic OLED is formed in the second OLED stack, in this case an inverted OLED, such that the second EML 330 is deposited after the nanoparticles of the outcoupling layer 305. Excitons generated in the second EML 330 also may couple to the nanoparticles in the outcoupling layer 305 directly, and then be radiated as photons. As in FIGS. 3A-3F, the substrate 300 may be located on either side of the device, i.e., it may be disposed over the device instead of below the device as shown.

Figure 6:
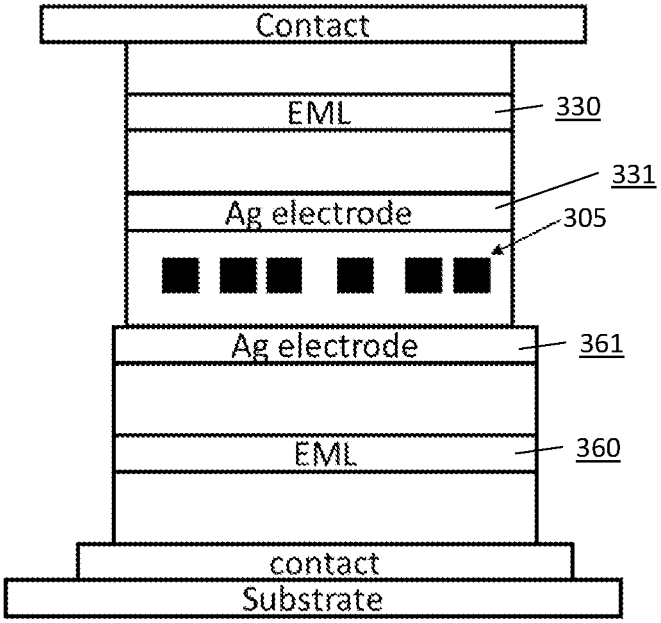
FIG. 6 shows an example of a plasmonic tandem OLED having two plasmonic OLEDs each of which has a separate enhancement layer, with a shared nanoparticle outcoupling layer as disclosed herein.
Figure 5A:
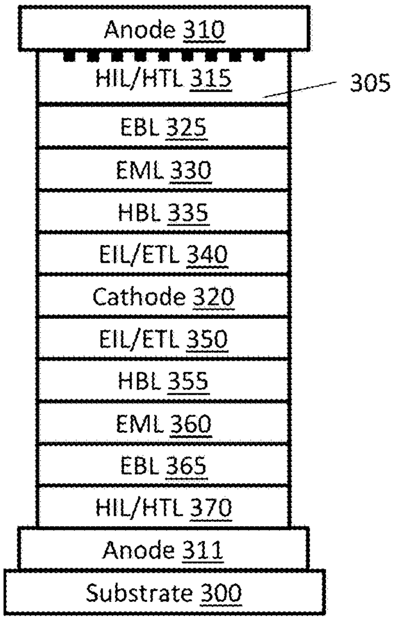
FIGS. 5A-5E examples of plasmonic tandem OLED that include an OLED in series with an IOLED and a common electrode to form plasmons, with an outcoupling layer to emit the plasmons as photons as disclosed herein.
Figure 5B:
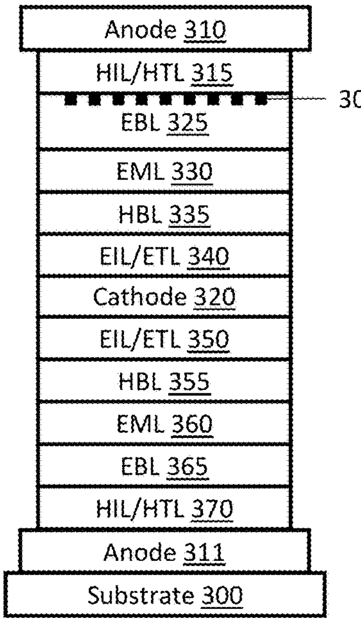
Figure 5C:
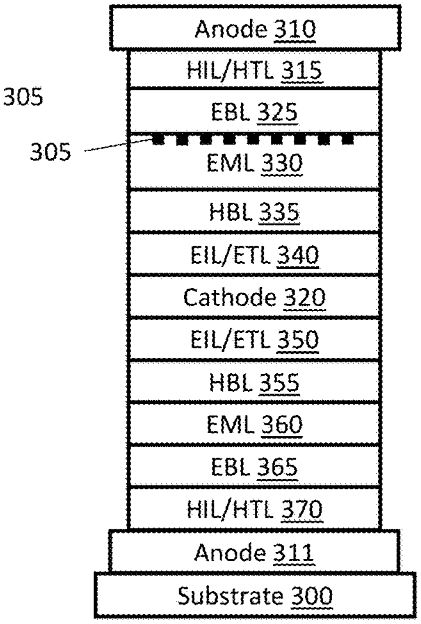
Figure 5D:
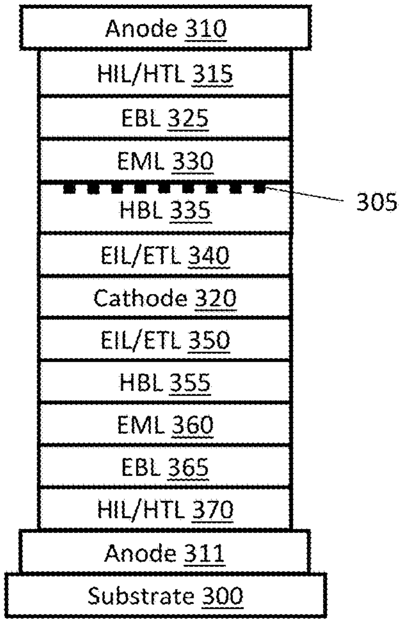
Figure 5E:
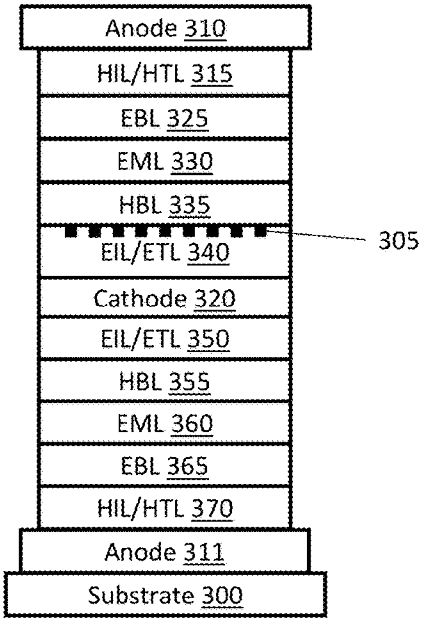

FIG. 6 shows another example of a device that includes two EMLs as disclosed herein. Each emissive region 330, 360 and corresponding plasmonic stack has its own enhancement layer 331, 361, respectively, but that there is only one outcoupling layer 305 that outcouples the energy in the plasmon mode of both enhancement layers. In this embodiment, if the matrix in which the nanoparticles are embedded to form the outcoupling layer 305 is partially or fairly conductive to charge, the two enhancement layers (such as Ag electrodes) 331, 361 may be treated as one electrical contact for the OLED devices.

A plasmonic device as disclosed herein, such as the top OLED including emissive layer 330 in FIGS. 3A-3H and 5A-5E, may have a total thickness in the range 5-100 nm, 10-70 nm, or 20-50 nm, excluding the thickness of the common cathode 320, common anode 395, or the CGL 322.

In some embodiments, the common cathode 320, common anode 395, and the CGL 322 may not provide the enhancement layer for plasmonic devices in the stack. Instead, a top or bottom electrode, such as anode 310, anode 311, cathode 321, cathode 390, cathode 391, or any other outer electrode in a stack as disclosed herein may function as the enhancement layer for plasmonic devices in the stack. In such an embodiment that uses an OLED and an IOLED, such as those shown in FIGS. 3A-3E, 3G, and 3H, the common electrode may be a thin CGL. That is, the common cathode 320 or the common anode 395 in FIGS. 3A-3E may be replaced by a CGL such as the CGL 322 shown in FIG. 3F, which may not have a separate external electrical connection. The EMLs 330, 360 may still both be within threshold distances from such a top common enhancement layer. The enhancement effect for the bottom device may not be as significant as the top stack due to the greater distance, but even in such a configuration the overall device performance is still improved relative to a conventional tandem device.

Although shown in various specific layers for illustration purposes, an outcoupling layer as disclosed herein, and especially a layer or other arrangement of nanoparticles, may be located in any device layer and, in some embodiments, the nanoparticles may not be fully contained by a single device layer. That is, nanoparticles or other structures used to provide outcoupling effects as disclosed herein may span or protrude into multiple layers. This may be the case where, for example, at least some nanoparticles in the outcoupling layer are taller than the thickness of a single layer. In the case where the layer(s) may not conformally coat all the nanoparticles in the layer (especially in the case of nanoparticles with sharp edges), the nanoparticles may protrude into other layers adjacent to the nanoparticle outcoupling layer. More generally, one or more layers may include nanoparticles dispersed or arranged within a portion of the layer, or multiple outcoupling components may be included in the device stack and/or within one or more layers.

In any of the device structures disclosed herein, the top anode 310 and the cathode 321 in FIG. 3F may be semi-transparent, for example by placement of a thin metal in series with an ITO cathode, to provide cavity emission from the upper OLED based on the common cathode 320 (such as a silver cathode) and the semi-transparent anode for the IOLED. As used herein, "semi-transparent" refers to a layer or layers that have at least 5%, more preferably 10%, more preferably 20% optical transmission over the visible spectrum. Such a device may result in non-Lambertian emission, as is common for cavity-based emission. Lambertian emission typically is highly desirable, but in some cases cavity emission may be preferred or advantageous, especially because the cavity can focus emission in a direction normal to the device while also modifying the emission color, for example, to provide a deep blue emission spectrum. More generally, any desired combination of emissive layers, color altering layers or components, quantum dots, color filters, downconversion layers or elements, or combinations thereof may be used to generate a desired output spectrum of the tandem device, including blue, deep blue, green, yellow, amber, red, near infrared, and white light. In some configurations, additional OLEDs as previously disclosed may be arranged in series in the stack, for example to provide a red/green/blue stack capable of generating white light. As another example, monochrome stacks with multiple emissive layers may be used, such as blue/blue/blue stacks, green/green/green stacks, or the like. Multi-colored but non-white producing stacks also may be used, such as blue/blue/green, blue/green/blue, blue/blue/blue/green, or the like. In some cases, "symmetric" stacks may be used in which the same order of emissive layers is repeated on each side of a central layer, in order moving outward from the central layer, such as red/green/red, deep blue/light blue/green/light blue/deep blue, or the like. More generally, 2, 3, 4, 5, 6, or any number of OLEDs may be arranged in series in a stack as disclosed herein, with at least two of the OLEDs including emissive materials that couple to the enhancement layer as previously disclosed.

Emissive layers disclosed herein, such as emissive layers 330, 360, may include one or more organic emissive materials ("emitters"). Each emissive material may be a phosphorescent emitter, a phosphor-sensitized fluorescent emitter, a thermally-activated delayed fluorescence (TADF) emitter, a phosphor-sensitized TADF, or a fluorescent emitter.

Although described and shown as having a common cathode 320, tandem structures as disclosed herein may use a common anode instead, in which case the order of layers in each device stack may be reversed. That is, the devices may be arranged such that each device has HIL/HTL closer to the common anode, and EIL/ETL closer to the outer cathodes of the device. Other layers may be arranged relative to the cathodes and common anode as may be expected based on known layer arrangements in the art, as well as the examples shown for single (non-tandem) devices in FIGS. 1-2.

In some embodiments, the outer electrodes 310, 311 (regardless of whether they are anodes or cathodes) may be electrically connected to one another, such that the inverted OLED 301 and the non-inverted OLED 302 are electrically arranged in parallel. In such a configuration, the OLED and IOLED may exhibit the same voltage during operation, while the entire device as a whole has a voltage that is not more than 120-150% of the voltage of either device for the same drive current. In contrast, a similar conventional tandem device would require twice the voltage (200%) of either individual OLED/IOLED device when operated at the same current and luminance.

Although in many cases it will be preferable for the central and/or common electrode to be at least semi-transparent as disclosed (or, in stacks with more than two OLEDs, for each intervening electrode and/or CGL to be at least semi-transparent), such as having a transparency of at least 5%, 10%, 15%, or 20% across the visible spectrum, in some configurations it may be acceptable or desirable for one or more such layers to be less transparent, i.e., at most 15%, 20%, 30%, 40%, 50%, 60%, 70%, 80%, 85%, or more, transmissive across the visible and/or near IR spectrum (i.e., transparency of not more than 15%, 20%, 30%, 40%, 50%, 60%, 70%, 80%, 85% or more). Such devices may still benefit from other effects described herein. For example, although at least a portion of light generated by one OLED in such a stack may not directly be emitted from the device due to the non-transparent or less-transparent common electrode or CGL layer, outcoupling from the layer or other structures in a plasmonic OLED as disclosed herein may still make use of such generated light.

In some embodiments, an OLED as disclosed herein can contain one or more compounds that can be used as a phosphorescent sensitizer, for example, in an emissive layer or other layer of the OLED as previously disclosed. In such a device, one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter. The sensitizer material may be the emissive material that couples to an enhancement layer as disclosed herein, or it may transfer energy to a fluorescent emitter or a TADF emitter as disclosed herein.

Additionally, in some embodiments, an emissive region may have one or more emissive layer. In an embodiment, the number of layers in each emissive region of each device may be the same. In alternative embodiment, the number of layers in each emissive region of each device may be different. In yet another alternative embodiment, the number of layers in some emissive regions of each device may be the same and some emissive regions of each device may be different. In some embodiments, an emissive layer of the one or more emissive layers of any emissive region may comprise a phosphorescent emissive material, a fluorescent emissive material or any combination thereof. In some embodiments, the emissive regions in the OLED may comprise a sensitizer and an acceptor with various sensitizing device characteristics disclosed in this application.

Tandem devices as disclosed herein may be constructed such that the individual OLED and/or IOLED device(s) have the same efficiency or different efficiencies. In some embodiments it may be desirable for the stacked devices to have efficiencies within 10%, 15%, or 20% of each other. In some embodiments it may be desirable for the stacked devices to operate at drive voltages within 10%, 15%, or 20% of each other at the same drive current. For example, it may be beneficial for the stacked devices to have similar characteristics such that, when connected in parallel, at the same drive voltage they would have similar currents and light output. Such an arrangement is not necessary in arrangements where the devices are driven independently.

As previously disclosed and shown herein, some embodiments may use an enhancement layer disposed within the device. The placement of light-emitting material in the vicinity of an enhancement layer, which can include metallic materials or other plasmonically-active materials, increases interactions with the surface plasmon polariton at the enhancement layer dielectric interface. The device is designed such that the non-radiative modes of the enhancement layer quench the light emitter. Light is subsequently created in free space by scattering the energy from the plasmonic modes of the enhancement layer through the use of an outcoupling layer. The enhancement layer non-radiatively couples to fluorescent, delayed-fluorescent, radical emitters, and phosphorescent light emitting materials but may be especially useful for phosphorescent light emitters due to their small radiative decay rate constant. Rapid de-excitation of the light emitting material via resonant energy transfer to the enhancement layer surface plasmon polariton is expected to increase the stability of the OLED.

An example embodiment uses a thin film of silver (Ag) as an enhancement layer. This thin film of silver has a surface plasmon mode. For simplicity, the example may be considered in the context of a single emitting material, but in various embodiments the "emissive material" may include multiple emitting materials, layers of materials which are doped at high volume fractions of emissive material, neat layers of emissive material, an emissive material doped into a host, an emissive layer that has multiple emitting materials, an emissive layer in which the emission originates from a state formed between two materials, such as an exciplex or an excimer, or combinations thereof. The emissive material may be an organic emissive material or, more generally, any emissive layer structure known in the OLED field.

In an OLED, an important aspect of the emissive material is the photon yield, which also may be referred to as the photo luminescent quantum yield (PLQY). The photon yield may be defined as:

$$\text{Photon yield} = \frac{k_{rad}^{total}}{k_{rad}^{total} + k_{non-rad}^{total}} \quad (1)$$

where $$k_{rad}^{total}$$

is the sum of all the radiative processes and $$k_{non\text{-}rad}^{total}$$

is the sum of all the non-radiative processes. For an isolated emitter in vacuum, the molecular radiative and non-radiative rates, $$k_{rad}^{0} \text{ and } k_{non-\mathrm{rad}}^{0}$$

are defined as the only radiative and non-radiative processes. For the isolated molecule, the yield of photons is then $$\text{Photon yield}^{0} = \frac{k_{rad}^{0}}{k_{rad}^{0} + k_{non-rad}^{0}} \quad (2)$$

Upon bringing an emissive material in proximity to the silver film, both the radiative and non-radiative rates may be modified as they are strongly dependent on the distance of the emitter from the interface between the metal and the dielectric medium in which the emitter sits. Equation (1) may then be re-cast into equation (3) by adding the terms of $$k_{rad}^{plasmon} \text{ and } k_{non\text{-}rad}^{plasmon},$$

where $$k_{rad}^{plasmon}$$

is the radiative rate due to the presence of the Ag film and $$k_{non\text{-}rad}^{plasmon}$$

is the non-radiative rate due to the presence of the Ag film:

$$\text{Photon yield} = \frac{k_{rad}^{total}}{k_{rad}^{total} + k_{non-rad}^{total}} = \frac{k_{rad}^{0} + k_{rad}^{plasmon}}{k_{rad}^{0} + k_{rad}^{plasmon} + k_{non-rad}^{0} + k_{non-rad}^{plasmon}} \quad (3)$$

Figure 7A:
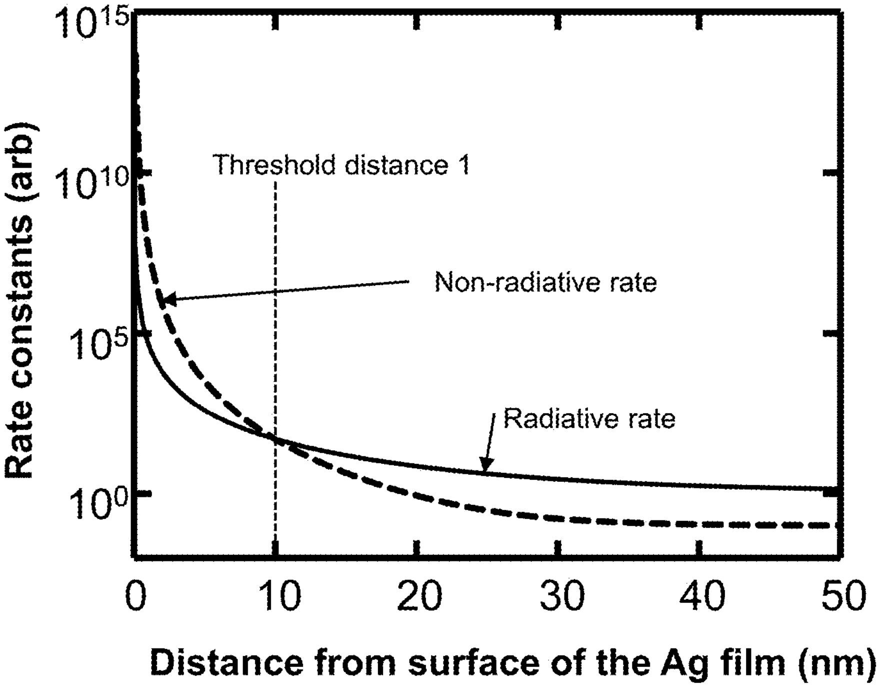
FIG. 7A shows a depiction of the rate constants versus distance from the surface of the silver film for an embodiment of an emissive material in an OLED with an enhancement layer of a silver film as disclosed herein. The distance is the distance from the metallic film surface closest to the emissive layer to the emissive material. A dashed line marks the distance at which the radiative rate is equal to the non-radiative rate and is threshold distance 1 as defined herein.

This is shown in FIG. 7A, which schematically depicts the total radiative and non-radiative rates for an emitter as a function of distance from the surface of the Ag film. The distance is the distance from the metallic film surface closest to the emissive layer to the emissive material. A dashed line marks the distance at which the radiative rate is equal to the non-radiative rate and is a threshold distance. At this threshold distance the photon yield is 50%. Further, this basic breakdown of rates shows why in typical OLED devices the emissive layer is positioned a large distance away from any plasmonically-active material. If the emissive layer is too close to the metal layer, the energy is coupled non-radiatively into the plasmon modes of the contact(s) and there is a reduction in the efficiency of the device. In embodiments that make use of an enhancement layer as disclosed herein, the energy that would otherwise be lost in the non-radiative mode of the thin Ag film is extracted as photons outside the device utilizing an outcoupling layer as previously disclosed. Thus, the energy coupled to the surface plasmon mode of the enhancement layer may be recovered and it is beneficial, instead of deleterious, to enhance the amount of non-radiative coupling to the surface plasmon mode of the Ag film.

Figure 7B:
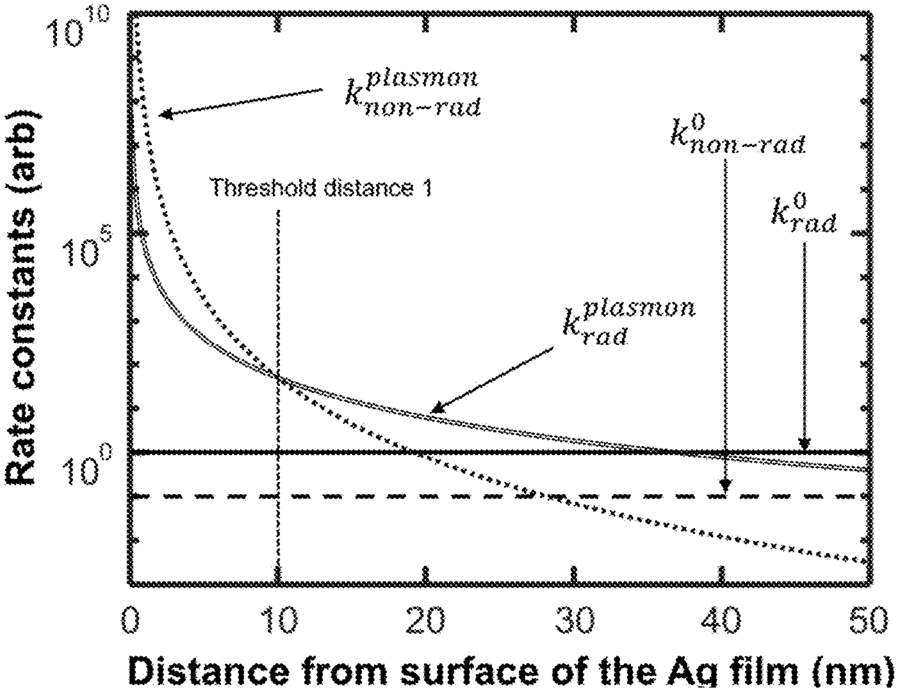
FIG. 7B shows rate constants versus distance from the surface of the silver film for an embodiment of an emissive material in an OLED with an enhancement layer of a silver film where the rate constants are broken out into example components as demonstrated in equation 3 as disclosed herein. The distance is the distance from the metallic film surface closest to the emissive layer to the emissive material.

To understand how to maximize the efficiency of the enhancement layer devices in this invention, some assumptions may be made about the relative dependence on distance for the plasmon radiative and non-radiative rates and break down the rate constants from FIG. 7A into the component rates as shown in FIG. 7B and described in equation 3. FIG. 7B shows the emitter's intrinsic radiative rate (solid line) as well as the radiative rate constant due to the emitter's proximity to the Ag thin film, which is $$k_{rad}^{plasmon}$$

in equation 3 (double line). The emitter's intrinsic radiative decay rate is not dependent on the distance from the Ag film, d. However, $$k_{rad}^{plasmon}$$

is dependent on the distance from the Ag film, where here it is assumed to have a $1/d^3$ dependence. This is an illustrative example only and the actual dependence on distance can be a more complicated function, for example, when d is less than 7 nm or when d is on the order of the wavelength of emission divided by two times the index of refraction. Like the radiative rate, the non-radiative rate in vacuum of the emitter is not a function of distance from the Ag film. However, the non-radiative rate due to the presence of the Ag film, $$k_{non\text{-}rad}^{plasmon},$$

is dependent on the distance from the Ag film and has a stronger dependence on distance than $$k_{rad}^{plasmon},$$

namely, $1/d^6$.

Figure 7C:
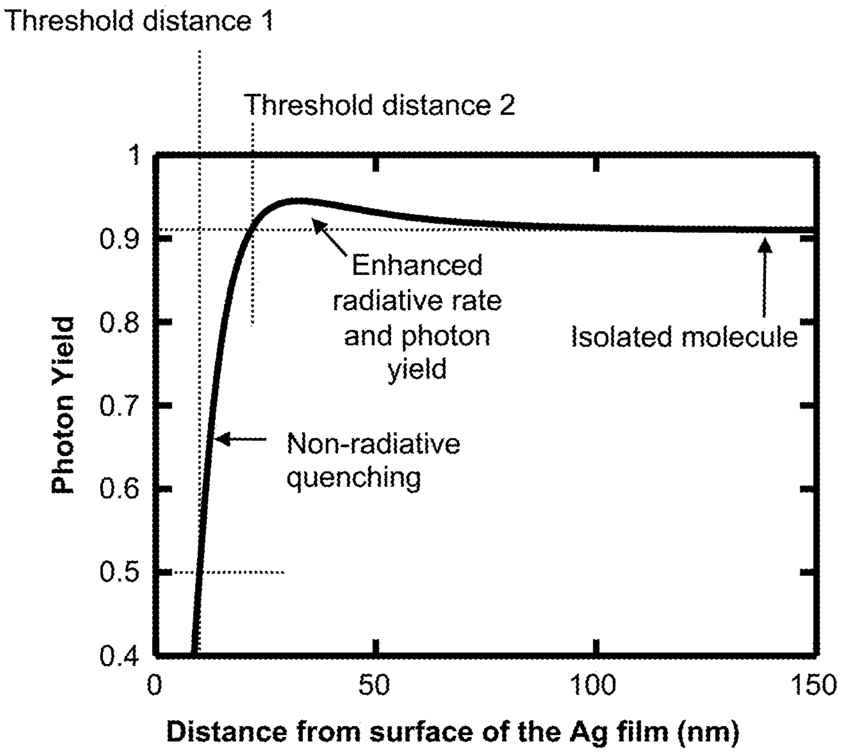
FIG. 7C shows photon yield versus distance from the surface of the silver film for an embodiment of an emissive material in an OLED with an enhancement layer of a silver film plotted for the rate constants in FIGS. 7 and 8 as disclosed herein. In this embodiment no outcoupling structure is part of or near the enhancement layer so all non-radiative coupling is dissipated as heat.
Figure 7D:
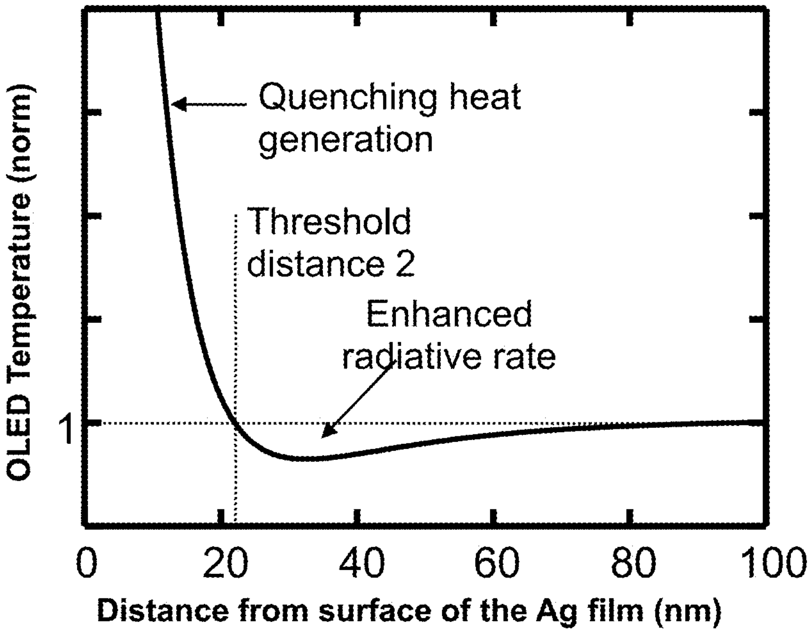
FIG. 7D shows the temperature of the OLED as a function of distance from the surface of the silver film for an embodiment of an emissive material in an OLED with an enhancement layer of a silver film plotted for the rate constants in FIGS. 7A and 7B as disclosed herein. In this embodiment no outcoupling structure is part of or near the enhancement layer so all non-radiative coupling is dissipated as heat which then increases the temperature of the OLED.

The different dependencies on distance from the metallic film results in a range of distances over which the radiative rate constant due to interaction with the surface plasmon is the largest rate constant. For these distances the photon yield is increased over the photon yield of an isolated molecule far from the metallic surface as shown in FIG. 7C. At these distances there is also a speed-up in the emission rate for the light emitting material. As d is reduced from this point, the emitter is quenched into the non-radiative modes to the surface plasmon mode of the Ag film, and the yield of photons decreases below the limit of the isolated molecule. The point at which yield is reduced due to quenching to the surface plasmon mode is threshold distance 2. This is the minimum distance at which the photon yield is the same as the emitter without the enhancement layer. At distances below this threshold distance, there is an even larger speed up in the rate at which energy leaves the light emitter as the non-radiative rate exceeds the radiative rate for these distances. Importantly, in FIG. 7C, it is clear that excitons are the source of energy transferred to the enhancement layer as the photon yield is lowered by moving the emission layer closer to the Ag thin film. Obtaining a curve similar in shape to FIG. 7C clearly indicates that excitons in the OLED are the species being quenching by the addition of the enhancement layer. Further, FIG. 7D is only one embodiment of the shape of the curve. In some cases where the distance dependence of $$k_{non\text{-}rad}^{plasmon}$$

is more similar to $$k_{rad}^{plasmon}$$

there may only be a continuous drop in the photon yield as d is reduced.

Using the rate constants from above, the threshold distance 2 may be defined as the distance at which the following inequality is satisfied:

$$\frac{k_{rad}^{0}+k_{rad}^{plasmon}}{k_{rad}^{0}+k_{rad}^{plasmon}+k_{rad}^{0}+k_{non-rad}^{0}} \leq \frac{k_{rad}^{0}}{k_{rad}^{0}+k_{non-rad}^{0}} \tag{4a}$$

$$k_{non-rad}^{plasmon} \geq \frac{k_{non-rad}^{0}}{k_{rad}^{0}} k_{rad}^{plasmon} \tag{4}$$

Plainly, equation 4a is the condition in which the PLQY when the enhancement layer is present is less than or equal to the photon yield without the enhancement layer. One knowledgeable in the art would not recommend operating when the photon yield is reduced as that typically reduces device efficiency. Equation 4 solves equation 4a for $$k_{non\text{-}rad}^{plasmon}$$

relative to the other rate constants. We can re-cast equation 4 explicitly utilizing the distance dependence of the plasmon rates as equation 5:

$$k_{non-rad}^{plasmon}(d) \geq \frac{k_{non-rad}^{0}}{k_{rad}^{0}} k_{rad}^{plasmon}(d) \tag{5}$$

Where d is the distance of the emitter from the surface of metallic film closest to the emitter.

Further, a threshold distance 1 is defined as the distance at which the emitter's photon yield is reduced to 50%. This threshold distance is the distance at which the total of the non-radiative rates from the emitter is equal to the total of the radiative rates of the emitter. Or plainly, the radiative rate of the emitter is equal to the non-radiative rate. Using the distance-dependent plasmonic rates and equation 3, we derive that the threshold distance 1 is when:

$$k_{non-rad}^{plasmon}(d)+k_{non-rad}^{0}=k_{rad}^{0}+k_{rad}^{plasmon}(d) \tag{6}$$

To determine threshold distance 1, if the enhancement layer does not radiate light, then one can simply grow an OLED, or comparable thin film representative examples, with the light-emitting material variable distances from the enhancement layer and determine at which distance the PLQY drops to 50%. If the enhancement layer has elements which enable outcoupling of light from the surface plasmon mode, these elements need to be removed to determine the threshold distance. It is important not to measure the relative increase or decrease in light output but the actual PLQY as the emission radiation pattern and absorption of the emitter can vary as the position of the emitter relative to the thin film of Ag is changed.

To determine threshold distance 2 as described by equation 4, one should measure the temperature of the OLED. Since non-radiative quenching of the exciton generates heat instead of photons, the OLED will heat up. Very simply, the heat generated in the OLED will be proportional to the yield of non-radiatively recombined excitons:

$$\text{Heat yield} \propto \frac{k_{non-rad}^{total}}{k_{rad}^{total}+k_{non-rad}^{total}} \tag{5}$$

As the distance between the light emitter and the metallic film is varied, the total heat conduction of the OLED will remain essentially constant, however, the heat yield will vary greatly.

FIG. 7D shows the steady state temperature of the OLED as the distance between the light emitter and metallic film is varied for a fixed current density of operation. For large distances of the emitting layer from the metallic surface there is no enhancement of the radiation or non-radiative quenching. The temperature of the OLED depends only on the total current density of operation and the efficiency of the light emitting material. As the emitter is brought closer to the metallic layer, the radiative rate increases and the photon yield is increases, reducing the heat generated in the OLED and the OLED's temperature. For distances shorter than threshold distance 2, the excitons on the light emitter are quenched as heat and the OLED's normalized temperature increases. This depiction of the temperature of the OLED is true when the enhancement layer is not outcoupling a predetermined significant fraction of energy in the surface plasmon mode as light. If there is outcoupling as part of the enhancement layer or an outcoupling layer is used in the device, such a layer is to be removed to perform this measurement of the threshold distance.

Two tests may be used to determine if the light emitter is positioned where the radiative or non-radiative surface plasmon rate constant is dominant using temperature. The first is to measure the temperature of the OLED devices with variable distance of the light emitting material from the metallic film, thereby replicating the schematic curve in FIG. 7D. The second is to replace the metallic film in the device structure with a transparent conducting oxide that does not have a strong surface plasmon resonance. An example material is indium tin oxide (ITO). Measuring the temperature of the device with the ITO and with the metallic film, if the temperature of the OLED with the metallic film is increased over the ITO control then the non-radiative rate is dominant and the emitter is within threshold distance 2 of the enhancement layer.

Non-radiative energy transfer to the plasmon mode here is defined as the process in which the exciton is transferred from the light-emitting material to the surface plasmon polariton (SPP), localized surface plasmon polariton (LSPP), or other terminology those versed in the art would understand as a plasmon, without emitting a photon. Depending on the dimensionality of the metallic film or the metallic nanoparticles this process can be called Forster energy transfer, Forster resonant energy transfer, surface resonant energy transfer, resonant energy transfer, non-radiative energy transfer, or other terminology common to those versed in the art. These terms describe the same fundamental process. For weakly emissive states, energy transfer to the SPP or LSPP may also occur through Dexter energy transfer, which involves the simultaneous exchange of two electrons. It may also occur as a two-step process of single electron transfer events. Non-radiative energy transfer is broadband, meaning that in some embodiments the enhancement layer is not tuned for a particular light emitting material.

Embodiments disclosed herein do not utilize the radiative rate enhancement of the surface plasmon polariton, but rather the non-radiative rate enhancement. This is contrary to the conventional teaching in the art of OLEDs and plasmonics, which teaches against energy transfer to the non-radiative mode of the surface plasmon polariton as that energy is typically lost as heat. In contrast, embodiments disclosed herein may intentionally put as much energy as possible into the non-radiative mode and then extract that energy to free space as light using an outcoupling layer before that energy is lost as heat. This is a novel idea because it is a unique two-step process and goes against what those knowledgeable in the art would teach about the non-radiative modes of a surface plasmon polariton.

Figure 7E:
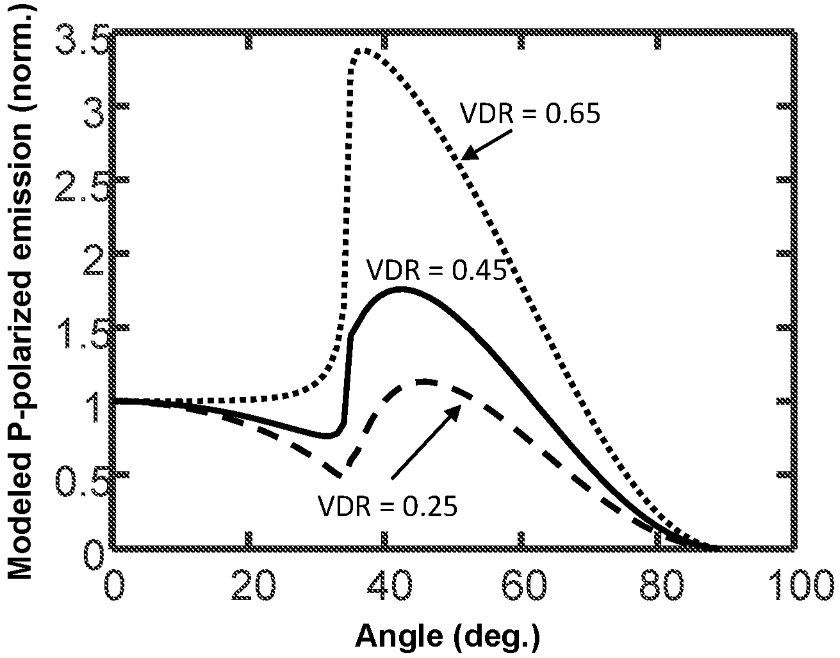
FIG. 7E shows modeled P-polarized photoluminescence as a function of angle for different VDR emitters as disclosed herein. In this example, there is a 30 nm thick film of material with index of 1.75 and the emission is monitored in a semi-infinite medium of index of 1.75. Each curve is normalized to a photoluminescence intensity of 1 at an angle of zero degrees, which is perpendicular to the surface of the film. As the VDR of the emitter is varied, the peak around 45 degrees increases greatly. When using software to fit the VDR of experimental data, the modeled VDR would be varied until the difference between the modeled data and the experimental data was minimized.

The vertical dipole ratio (VDR) is the ensemble averaged fraction of dipoles that are oriented vertically. A similar concept is horizontal dipole ratio (HDR) is the ensemble average fraction of dipoles oriented horizontally. By definition, VDR+HDR=1. VDR can be measured by angle dependent, polarization dependent, photoluminescence measurements. By comparing the measured emission pattern of a photoexcited thin film sample, as a function of polarization, to the computationally modeled pattern, one can determine VDR of the emission layer. For example, in FIG. 7E, the modelled p-polarized angle PL is plotted for emitters with different VDRs. There is a peak in the data around 45 degrees with that peak in the data being larger when the VDR of the emitter is higher, as shown in the modeled data of p-polarized emission in FIG. 7E.

Importantly, the VDR represents the average dipole orientation of the light-emitting species. Thus, if there are additional emitters in the emissive layer that are not contributing to the emission, the VDR measurement does not report or reflect their VDR. Further, by inclusion of a host that interacts with the emitter, the VDR of a given emitter can be modified, resulting in the measured VDR for the layer that is different from that of the emitter in a different host. Further, in some embodiments, exciplex or excimers are desirable which form emissive states between two neighboring molecules. These emissive states may have a VDR that is different than that if only one of the components of the exciplex or excimer were emitting.

The HOMO energy is estimated from the first oxidation potential derived from cyclic voltammetry. The LUMO energy is estimated from the first reduction potential derived from cyclic voltammetry. The triplet energy T1 of the emitter compounds is measured using the peak wavelength from the photoluminescence at 77K. Solution cyclic voltammetry and differential pulsed voltammetry were performed using a CH Instruments model 6201B potentiostat using anhydrous dimethylformamide solvent and tetrabutylammonium hexafluorophosphate as the supporting electrolyte. Glassy carbon, and platinum and silver wires were used as the working, counter and reference electrodes, respectively. Electrochemical potentials were referenced to an internal ferrocene-ferroconium redox couple (Fc+/Fc) by measuring the peak potential differences from differential pulsed voltammetry. The $E_{HOMO}=-[(E_{ox1}$ vs Fc+/Fc)+4.8], and the $E_{LUMO}=-[(E_{red1}$ vs Fc+/Fc)+4.8], where $E_{ox1}$ is the first oxidation potential and the $E_{red1}$ is the first reduction potential.

In some embodiments, a device as disclosed herein may include an additional layer disposed over the nanoparticles and may be disposed directly over and in direct physical contact with at least some of the nanoparticles. The additional layer may include one or more emitter molecules. The additional layer may match a refractive index beneath the first electrode layer. The additional layer has a thickness of 1000 nm or less.

In some embodiments the LED stack, the enhancement layer, and/or the nanoparticles may be encapsulated. Such encapsulation materials include oxide coatings and epoxies e.g. polyurethane, silicone, and the like, and may be deposited by atomic layer deposition or chemical vapor deposition In some embodiments, a white OLED or LED may utilize a nanoparticle outcoupling scheme of a specific resonance to selectively outcouple a certain wavelength range. In this way, a white OLED or LED can be fabricated over a large area and the resonance of the nanoparticle outcoupling scheme (via choosing nanoparticle size, refractive index, etc.) may be utilized to create red, green, blue (or any other desired color) subpixels.

Figure 7F:
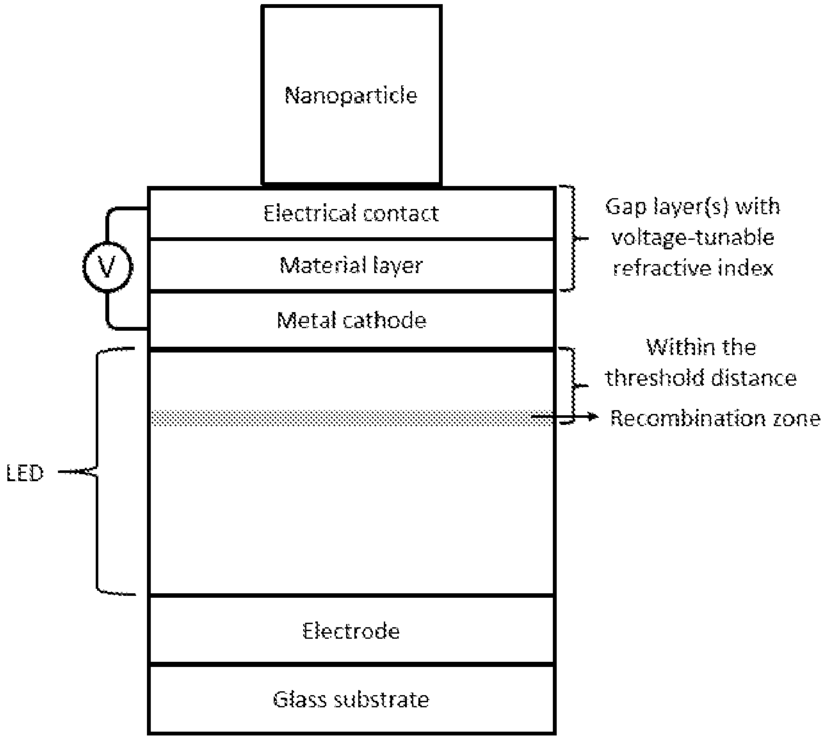
FIG. 7F shows a nanoparticle and enhancement layer arranged to form a nanoparticle based outcoupling element which uses a dielectric material with voltage-tunable refractive index for selecting the wavelength of emitted light as disclosed herein.

In some embodiments, an arrangement of nanoparticles, dielectric layer, and enhancement layer as disclosed herein may form a nanoparticle based outcoupling element. Examples of nanoparticle based outcoupling elements, which may also be referred to in prior publications as nanopatch antennas, are disclosed in further detail in U.S. Pat. No. 11,139,442 and U.S. Patent Publication Nos. 2021/0265584 and 2021/0249633, the disclosure of each of which is incorporated by reference in its entirety. Since the refractive index of the dielectric layer(s) (or dielectric spacer layer(s))affects the resonance of the nanoparticle based outcoupling element, incorporating dielectric layer materials that have non-linear optical properties and/or voltage-tunable refractive index serves as a way to tune the emission spectrum with voltage applied between the metal cathode and an electrical contact layer beneath the nanoparticle, as shown in FIG. 7F. In one example, aluminum-doped zinc oxide may be used as the voltage-tunable refractive index material since its permittivity is varied when an applied voltage modifies the carrier concentration. In this case, a second insulating layer is needed in the dielectric layer to build the charge, but such a secondary layer may not always be necessary depending on the material properties of the voltage-tunable refractive index layer. This is particularly useful when the OLED or LED is a white emitting, i.e., containing red, green, and blue emission, since the voltage-tunable nanoparticle based outcoupling element resonance can act as a color filter to selectively pass the desired color. This effectively converts the OLED or LED into a three-terminal device, with the voltage applied between the anode and cathode operating the OLED/LED, and the voltage applied between the cathode and the electrical contact layer beneath the nanoparticle tuning the nanoparticle based outcoupling element resonance to select the emitted color.

In the case of individual OLED or LED subpixels, for example in a display panel, the resonance of the nanoparticle outcoupling scheme may be purposely mismatched from the native emission of the device. In this way, the nanoparticle outcoupling scheme acts as a color filter to slightly shift the peak wavelength. In another embodiment, a resonance-mismatched nanoparticle outcoupling scheme may be used to narrow the emission spectrum. For example, a green OLED or LED paired with a blue resonant outcoupling scheme will see a narrowing by reducing the LEDs redder wavelengths. Conversely, pairing a green OLED or LED with a red resonance outcoupling scheme will see a narrowing by reducing the device's bluer wavelengths.

The device may include one or more emissive outcoupling layers in close proximity to the enhancement layer as shown in FIGS. 7G-7I, which may be used in conjunction with other emissive materials and layers elsewhere in the device as previously disclosed. FIG. 7G schematically shows a preferred nanoparticle based outcoupling architecture. The image depicts a dielectric layer with embedded emitters between the nanoparticle and enhancement layer. FIG. 7H shows a similar device architecture in which the emitters in the emissive layer are placed beneath the enhancement layer (i.e., not in the dielectric layer). FIG. 7I shows a variation of the design which includes a capping layer atop the nanoparticle, which may or may not contain additional emitters. This emissive outcoupling layers may contain an emissive material that can be excited by the energy of the surface plasmon polaritons in the nearby enhancement layer. The emissive material may be, but is not limited to, any organic emissive material as is known in the OLED field, a quantum dot, perovskite nanocrystals, metal-organic frameworks, covalent-organic frameworks, a thermally activated delayed fluorescence (TADF) emitter, a fluorescent emitter, or a phosphorescent organic emitter. It may be advantageous for the emissive material to have absorption and emission spectra demonstrating a small Stokes shift, such that only a small red-shift occurs between the LED excited state energy that is quenched into the enhancement layer and the emitted light from the emissive outcoupling layer(s). This preserves the emission color of the device. In another example device, the emissive material can be specifically chosen to down-convert a higher-energy excitation (eg. blue) to a lower-energy wavelength (eg. green or red). This enables a single LED structure to be utilized in every pixel of a display, with the color chosen by the emissive outcoupling layer. For example, this can be accomplished by depositing different-sized quantum dots in the outcoupling layer(s) of different pixels to tune the emission wavelength. The emissive outcoupling layer may or may not be combined with the nanoparticle based outcoupling scheme, in which case the emissive outcoupling layer would sit between the enhancement layer and the nanoparticle. In this case, the outcoupling efficiency may be enhanced even further as the radiative rate of the emissive material in the emissive outcoupling layer should be sped up.

The arrangement of the nanoparticles on the surface of the dielectric layer also may be selected to fit a specific device application. For example, a random arrangement of nanoparticles results in a nearly Lambertian emission profile, which may be preferable for use in lighting applications or display applications where point source emission is not desired. Inorganic LEDs tend to suffer from directional emission profiles thereby making the random nanoparticle array particularly attractive in certain applications. As another example, the nanoparticles may be arranged into an array as previously disclosed, thereby resulting in a dispersive emission profile that may be desired for some mobile applications or in applications that require the most outcoupling of light regardless of the angular dependence. Nanoparticles arranged into an array may achieve greater efficiencies than randomly arranged nanoparticles and selecting a specific array pitch and duty cycle will enable tuning of the array resonance and hence outcoupling wavelength at which the array has the largest efficiency.

Enhancement layers and/or nanoparticles as disclosed herein may include planar metals, stacks of metal layers and dielectric layers, stacks of metal layers and semiconducting layers, and perforated metal layers. The dielectric materials that suitable for use in the enhancement layer can include but are not limited to oxides, fluorides, nitrides, and amorphous mixtures of materials. The metal layers can include alloys and mixtures of metals from the following: Ag, Au, Al, Zn, Ir, Pt, Ni, Cu, W, Ta, Fe, Cr, Mg, Ga, Rh, Ti, Ca, Ru, Pd, In, Bi. The enhancement layer may be graphene or conductive oxides or conductive nitrides for devices outside the visible range.

An enhancement layer as disclosed herein may be patterned with nano-sized holes. The holes may be in an array or randomly or pseudo-randomly arranged. The size, shape, and orientation of the holes sets the frequency of light that can be outcoupled from the enhancement layer.

The enhancement layer may include a bullseye grating patterned on top of it. In some embodiments, the enhancement layer has a dielectric layer and then a bullseye grating patterned on top of the dielectric layer material.

In some embodiments the enhancement layer may be partially etched through to form nano-size outcoupling features on one side of the enhancement layer. In some embodiments, there are nano-sized features on both sides of the enhancement layer. In some cases when there are nano-sized features on both sides of the enhancement layer, the features smallest dimension will exceed 10 nm, in other cases it will exceed 20 nm, in other cases it will exceed 50 nm.

Devices fabricated in accordance with the present invention can also include other components for controlling and manipulating light from the end product. These components include polarizers, color filters, and liquid crystals.

Inorganic LEDs used with embodiments disclosed herein may be fabricated from materials including but not limited to: GaAs, AlGaAs, GaAsP, AlGaInP, GaP, GaAsP, GaN, InGaN, ZnSe, SiC, $Si_3N_4$, Si, Ge, Sapphire, BN, ZnO, AlGaN, perovskites, and quantum dots (both electrically driven and as photoluminescent components). LEDs may be directly fabricated on a wafer and then pick and placed to create a larger electronic component module. Within the module, there may be additional LEDs which do not utilize the enhancement layer. In particular, devices based on electrically-driven excitonic quantum dots will also benefit from the increased optical density of states provided by the enhancement layer. The subsequent reduction in excited state lifetime may improve device stability. Further, plasmonic out-coupling may serve to select a specific range of emitted wavelengths, like a color filter, or may serve to narrow a broad emission spectrum, depending on the configuration of the nanoparticles in out-coupling scheme. Additionally, plasmon out-coupling efficiencies may exceed the current state-of-the-art in electrically-driven quantum dot devices. Further, the decrease in excited state duration due to the enhancement layer will in turn reduced roll-off in these devices as well as increase the operational stability.

The transition dipole orientation affects plasmon coupling efficiency and coupling distance, with coupling increasing as the dipole is more vertically oriented or has a higher VDR. Therefore, vertically oriented dipoles are most preferable for this device design. However, in practice, due to surface roughness of the enhancement layer, even perfectly horizontal dipoles will have some coupling efficiency to the plasmon mode.

In embodiments which use LEDs, the LEDs also may be combined with one or more phosphorescent emitters to produce to produce a wider range of colors from the LED e.g. white. The phosphor(s) may be placed a) in the epoxy used to encapsulate the LED or b) the phosphor can be placed remote from the LED. The phosphor acts as a 'down conversion' layer designed to absorb photons from the LED and reemit photons of a lower energy. Other down conversion materials that can used can be made of inorganic or organic phosphors, fluorescent, TADF, quantum dot, perovskite nanocrystals, metal-organic frameworks, or covalent-organic frameworks materials. Therefore, the embodiments of our invention that include enhancement layer and a nano size outcoupling scheme consisting of in one embodiment a metal, and a dielectric layer material, and a layer of nanoparticles can be placed between the inorganic LED and the phosphor or down conversion layer. The LED/metal a dielectric layer material/layer of nanoparticles device can be encapsulated with epoxy or a film containing the down conversion medium. The down conversion material can also be place outside of the LED/metal a dielectric layer material/layer of nanoparticles encapsulation.

Other options to produce white light are the use homoepitaxial ZnSe blue LED grown on a ZnSe substrate, which simultaneously produces blue light from the active region and yellow emission from the substrate and GaN on Si (or SiC or sapphire) substrates. This invention can be combined with these devices.

Devices fabricated in accordance with embodiments of this invention can also be combined with QNED technology in which GaN-based blue light emitting nanorod LEDs replace discreet inorganic LEDs as the pixelated blue light sources in a display.

The dielectric layer/nanoparticle outcoupling layer arrangement disclosed herein may be combined with a spacer (or surface plasmon amplification by stimulated emission of radiation or plasmonic laser), or surface plasmon polariton (SPP) spacers or nanolasers, and will convert the plasmon energy back into photons.

In some embodiments, the LEDs formed with the enhancement layer and outcoupling scheme may be directly patterned on a wafer or substrate which then is incorporated into the electronic component module. In these cases, if one wishes to eliminate devices which are not in specification (for example, ideal peak wavelength) they can be eliminated by not including the outcoupling layer on the device since inclusion of the enhancement layer will make the LED more dim. In some embodiments of patterning a R,G,B full color module on a single substrate, at least one color sub-pixel will have the enhancement layer and outcoupling scheme.

According to an embodiment, a light emitting diode/device (LED) is provided. The LED can include a substrate, an anode (or p-type contact), a cathode (n-type contact), and recombination zone disposed between the anode and the cathode and an enhancement layer. According to an embodiment, the light emitting device is incorporated into one or more device selected from a consumer product, an electronic component module, a lighting panel, and/or a sign or display.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic emissive device comprising:

a substrate;

a first organic light emitting device (OLED) disposed over the substrate, the first OLED comprising a first emissive layer of a first organic emissive material;

a second OLED disposed over the substrate and in a stack with the first OLED, the second OLED comprising a second emissive layer of a second organic emissive material; and an enhancement layer disposed over the substrate, the enhancement layer comprising a plasmonic material exhibiting surface plasmon resonance that non-radiatively couples to both the first and second organic emissive materials and transfers excited state energy from each non-radiatively-coupled organic emissive material to non-radiative modes of surface plasmon polaritons.

2. The organic emissive device of claim 1, wherein the enhancement layer is disposed a threshold distance away from the first and/or second emissive layers.

3. The organic emissive device of claim 2, wherein the threshold distance is a distance at which the total non-radiative decay rate constant of the first or second organic emissive material is equal to the total radiative decay rate constant of the first or second organic emissive material, respectively.

4. The organic emissive device of claim 2, wherein the first or second organic emissive material has a total non-radiative decay rate constant $$k^0_{non\text{-}rad},$$

a total radiative decay rate constant $$k_{rad}^{0},$$

a total non-radiative decay rate constant due to the enhancement layer $$k_{non\text{-}rad}^{plasmon},$$

and a total radiative decay rate constant due to the enhancement layer $$k_{rad}^{plasmon};$$

and wherein the threshold distance is a distance at which $$\frac{k_{rad}^{plasmon}}{k_{non-rad}^{plasmon}} = \frac{k_{rad}^{0}}{k_{non-rad}^{0}}.$$

5. The organic emissive device of claim 2, wherein the enhancement layer is disposed not more than a threshold distance away from the first emissive layer and the second emissive layer.

6. The organic emissive device of claim 1, wherein the first emissive layer comprises a phosphorescent emitter.

7. The organic emissive device of claim 1, wherein the enhancement layer is disposed between the first OLED and the second OLED.

8. The organic emissive device of claim 1, wherein the enhancement layer functions as an anode for the first OLED and a cathode for the second OLED.

9. The organic emissive device of claim 1, wherein the enhancement layer functions as a cathode for the first OLED and for the second OLED.

10. The organic emissive device of claim 1, wherein the enhancement layer functions as an anode for the first OLED and for the second OLED.

11. The organic emissive device of claim 1, further comprising an outcoupling layer configured to outcouple the surface plasmon polaritons from the device as photons, wherein the outcoupling layer outcouples excited state energy from both the first emissive layer and the second emissive layer.

12. The organic emissive device of claim 11, wherein the outcoupling layer comprises a plurality of nanoparticles.

13. The organic emissive device of claim 11, wherein the outcoupling layer outcouples light from both the first emissive layer and the second emissive layer.

14. The organic emissive device of claim 1, wherein the first OLED is an inverted OLED and the second OLED is a non-inverted OLED.

15. The organic emissive device of claim 1, wherein the second OLED is disposed adjacent to the first OLED and wherein the first and second OLEDs share a common electrode.

16. The organic emissive device of claim 15, wherein the common electrode is the enhancement layer.

17. The organic emissive device of claim 15, wherein the common electrode has a transparency of at least 5%, 10%, 15%, or 20% across the visible spectrum, or not more than 60%, 70%, or 80% across the visible spectrum.

18. The organic emissive device of claim 1, wherein the first and/or second emissive materials comprises a material independently selected from the group consisting of: a phosphorescent emitter, a phosphor-sensitized fluorescent emitter, a thermally-activated delayed fluorescence (TADF) emitter, a phosphor-sensitized TADF, and a fluorescent emitter.

19. A consumer electronic device comprising:

a substrate;

a first organic light emitting device (OLED) disposed over the substrate, the first OLED comprising a first emissive layer of a first organic emissive material;

a second OLED disposed over the substrate and in a stack with the first OLED, the second OLED comprising a second emissive layer of a second organic emissive material; and an enhancement layer disposed over the substrate, the enhancement layer comprising a plasmonic material exhibiting surface plasmon resonance that non-radiatively couples to both the first and second organic emissive materials and transfers excited state energy from each non-radiatively-coupled organic emissive material to non-radiative modes of surface plasmon polaritons, wherein the enhancement layer is disposed a threshold distance away from the first and/or second emissive layers.

20. The consumer electronic device of claim 19, wherein the device is at least one type selected from the group consisting of: a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign.

* * * * *